(12) United States Patent
Song

(10) Patent No.: US 8,085,545 B2
(45) Date of Patent: Dec. 27, 2011

(54) STRUCTURE FOR BLOCKING AN ELECTROMAGNETIC INTERFERENCE, WAFER LEVEL PACKAGE AND PRINTED CIRCUIT BOARD HAVING THE SAME

(75) Inventor: Eun-Seok Song, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 399 days.

(21) Appl. No.: 12/453,720

(22) Filed: May 20, 2009

(65) Prior Publication Data
US 2009/0290320 A1    Nov. 26, 2009

(30) Foreign Application Priority Data
May 21, 2008    (KR) .................. 10-2008-0047165

(51) Int. Cl.
H05K 7/00    (2006.01)
(52) U.S. Cl. ..................... 361/760; 257/288
(58) Field of Classification Search ............. 361/760, 361/777, 782, 783; 333/124, 128; 257/212, 257/288
See application file for complete search history.

(56) References Cited

U.S. PATENT DOCUMENTS
7,974,103 B2* 7/2011 Lim et al. .................. 361/777
7,986,023 B2* 7/2011 Tews et al. ................. 257/528

FOREIGN PATENT DOCUMENTS
| JP | 11-176978 | 7/1999 |
| JP | 2001-284538 | 10/2001 |
| KR | 10-2001-0086741 | 9/2001 |
| KR | 10-0606654 | 7/2006 |

* cited by examiner

*Primary Examiner* — Khiem Nguyen
(74) *Attorney, Agent, or Firm* — Harness, Dickey & Pierce, P.L.C.

(57) ABSTRACT

A structure for blocking electromagnetic interference (EMI) may include at least one electromagnetic wave inducing member and an electromagnetic wave filtering member. The at least one electromagnetic wave inducing member may be provided to an electronic device to induce an electromagnetic wave applied to the electronic device. The electromagnetic wave filtering member may be provided to the electronic device to filter the electromagnetic wave induced by the at least one electromagnetic wave inducing member. Thus, the electromagnetic wave filtering member may remove the electromagnetic wave concentrated on the at least one electromagnetic wave inducing member, so that the electromagnetic wave applied to the electronic device may be effectively removed. As a result, circuits in the electronic device may be protected from the EMI.

20 Claims, 4 Drawing Sheets

STRUCTURE FOR BLOCKING AN ELECTROMAGNETIC INTERFERENCE, WAFER LEVEL PACKAGE AND PRINTED CIRCUIT BOARD HAVING THE SAME

PRIORITY STATEMENT

This application claims priority under 35 USC §119 to Korean Patent Application No. 2008-47165, filed on May 21, 2008 in the Korean Intellectual Property Office (KIPO), the entire contents of which are incorporated herein by reference.

BACKGROUND

1. Field

Example embodiments relate to a structure for blocking an electromagnetic interference, a wafer level package and a printed circuit board having the same. More particularly, example embodiments relate to a structure for protecting circuits of electronic devices from an electromagnetic interference, a wafer level package and a printed circuit board having the same.

2. Description of the Related Art

Generally, various semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

According to a conventional packaging method, a wafer may be cut along a scribe lane to divide the wafer into semiconductor chips. The semiconductor chips may be attached to a package substrate. Bonding pads of the semiconductor chips may be electrically connected with the package substrate using conductive wires. A molding member may be formed on the package substrate to surround the semiconductor chips with the molding member. External terminals, e.g., solder balls, may be mounted on the package substrate.

However, because the conventional packaging method may be separately performed on each of the semiconductor chips, the conventional packaging method may have low efficiency.

In order to solve the above-mentioned problem, a wafer level packaging method may be proposed. According to the wafer level packaging method, after a packaging process may be performed on the wafer, the wafer may then be cut to form wafer level packages.

The wafer level package may include a semiconductor chip having bonding pads, a first insulating layer, a conductive layer pattern, a second insulating layer pattern and conductive bumps. The first insulating layer pattern may be formed on a first surface of the semiconductor chip. Further, the first insulating layer pattern may have openings configured to expose the bonding pads. The conductive layer pattern may be formed on the first insulating layer pattern. The conductive layer pattern may have a first end electrically connected to the bonding pads. The second insulating layer pattern may be formed on the first insulating layer pattern. The second insulating layer pattern may have an opening configured to expose a second end of the conductive layer pattern opposite to the first end. The conductive bumps may electrically make contact with the second end of the conductive layer pattern.

The wafer level package may have a weak structure with respect to electromagnetic interference (EMI), because the wafer level package may not be surrounded with a molding member. In order to decrease the EMI, an electromagnetic wave filter layer including a ferrite material may be formed on a second surface of the semiconductor chip opposite to the first surface.

However, the electromagnetic wave filter layer may not surround entire surfaces of the wafer level package due to an electrical short. Thus, the wafer level package may still have a weak structure with respect to the EMI.

SUMMARY

Example embodiments provide a structure for protecting circuits of electronic devices from an electromagnetic interference. Example embodiments also provide a wafer level package having the above-mentioned structure. Example embodiments still also provide a printed circuit board (PCB) having the above-mentioned structure.

According to example embodiments, there may be provided a structure for blocking electromagnetic interference (EMI). The structure may include at least one electromagnetic wave inducing member and an electromagnetic wave filtering member. The at least one electromagnetic wave inducing member may be provided to an electronic device to induce an electromagnetic wave applied to the electronic device. The electromagnetic wave filtering member may be provided to the electronic device to filter the electromagnetic wave induced by the at least one electromagnetic wave inducing member.

In example embodiments, the at least one electromagnetic wave inducing member may have a protrusion configured to enhance an electromagnetic wave induction. The protrusion may have a sharp end. The at least one electromagnetic wave inducing member may be arranged at a central portion of the electronic device. Alternatively, the at least one electromagnetic wave inducing member may be arranged at the central portion and an edge portion of the electronic device. The at least one electromagnetic wave inducing member may be lengthwise and breadthwise spaced apart from each other by a similar interval. The at least one electromagnetic wave inducing member may have a circular shape or a tetragonal shape. In example embodiments, the electromagnetic wave filtering member may have a shape configured to surround the electromagnetic wave inducing member. The electromagnetic wave filtering member may include a ferrite material.

According to example embodiments, there may be provided a wafer level package. The wafer level package may include a semiconductor chip, a first insulating layer pattern, a conductive layer pattern, a second insulating layer pattern, an electromagnetic wave inducing member and an electromagnetic wave filtering member. The semiconductor chip may have at least one bonding pad. The first insulating layer pattern may be formed on a first surface of the semiconductor chip. Further, the first insulating layer pattern may have at least one opening configured to expose the at least one bonding pad. The conductive layer pattern may be formed on the first insulating layer pattern. The conductive layer pattern may have a first end electrically connected to the at least one bonding pad. The second insulating layer pattern may be formed on the first insulating layer pattern.

The second insulating layer pattern may have an opening configured to expose a second end of the conductive layer pattern opposite to the first end. The at least one electromagnetic wave inducing member may be formed on a second surface of the semiconductor chip opposite to the first surface to induce an electromagnetic wave applied to the electronic device. The electromagnetic wave filtering member may be formed on the second surface of the semiconductor chip to filter the electromagnetic wave induced by the electromagnetic wave inducing member. In example embodiments, the wafer level package may further include at least one conductive bump electrically making contact with the second end of the conductive layer pattern.

The at least one conductive bump may be formed in the at least one opening of the second insulating layer pattern. The at least one conductive bump may be at least one solder ball. The wafer level package may further include an under bump metallurgy (UBM) layer between the at least one conductive bump and an inner surface of the at least one opening of the second insulating layer pattern. The first surface may be oriented in a downward direction and the second surface may be oriented in an upward direction.

According to example embodiments, there may be provided a PCB. The PCB may include an insulating member, at least one contact pads an electromagnetic wave inducing member and an electromagnetic wave filtering member. A circuit may be built in the insulating member. The at least one contact pad may be formed on a first surface of the insulating member to electrically connect the at least one contact pad with a semiconductor package. The at least one electromagnetic wave inducing member may be formed on the first surface of the insulating member to induce an electromagnetic wave applied to the circuit. The electromagnetic wave filtering member may be formed on the first surface of the insulating member to filter the electromagnetic wave induced by the at least one electromagnetic wave inducing member.

In example embodiments, the PCB may further include at least one conductive bump on a second surface of the insulating member opposite to the first surface and electrically connected to the circuit. at least one conductive bump on a second surface of the insulating member opposite to the first surface and electrically connected to the circuit. The at least one conductive bump may be at least one solder ball. The at least one contact pad may be on a central portion of the first surface of the insulating member.

According to example embodiments, the electromagnetic wave filtering member may remove the electromagnetic wave concentrated on the at least one electromagnetic wave inducing member, so that the electromagnetic wave applied to the wafer level package or the PCB may be effectively removed. Thus, circuits in the wafer level package or the PCB may be protected from the electromagnetic wave.

BRIEF DESCRIPTION OF THE DRAWINGS

Example embodiments will be more clearly understood from the following detailed description taken in conjunction with the accompanying drawings.

FIG. 1 is a cross-sectional view illustrating a wafer level package in accordance with example embodiments;

FIG. 2 is a plan view illustrating the wafer level package in FIG. 1;

FIG. 3 is a cross-sectional view illustrating a wafer level package in accordance with example embodiments;

FIG. 4 is a plan view illustrating a wafer level package in accordance with example embodiments;

FIG. 5 is a plan view illustrating a wafer level package in accordance with example embodiments;

FIG. 6 is a plan view illustrating a wafer level package in accordance with example embodiments; and FIG. 7 is a cross-sectional view illustrating a printed circuit board (PCB) in accordance with example embodiments.

Figure 1:
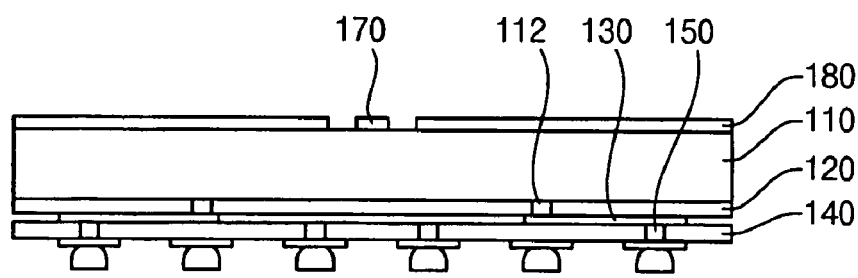
FIGS. 1 to 7 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

Figure 2:
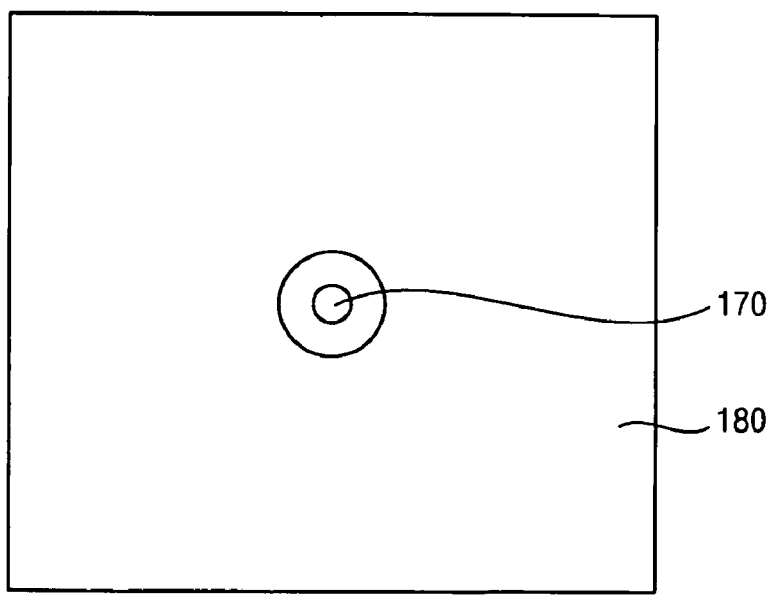

FIG. 1 is a cross-sectional view illustrating a wafer level package in accordance with example embodiments, and FIG. 2 is a plan view illustrating the wafer level package in FIG. 1. Referring to FIG. 1, a wafer level package 100 of example embodiments may include a semiconductor chip 110, a first insulating layer pattern 120, a conductive layer pattern 130, a second insulating layer pattern 140, conductive bumps 150 and a structure for blocking an EMI.

The semiconductor chip 110 may have a first surface and a second surface opposite to the first surface. Bonding pads 112 may be arranged on the first surface of the semiconductor chip 110. In example embodiments, the first surface may be oriented toward a downward direction. The second surface may be oriented toward an upward direction. The first insulating layer pattern 120 may be formed on the first surface of the semiconductor chip 110. The first insulating layer pattern 120 may have openings configured to expose the bonding pads 112.

The conductive layer pattern 130 may be formed on the first insulating layer pattern 120. The conductive layer pattern 130 may have a first end located in the opening of the first insulating layer pattern 120 and electrically connected to the bonding pad 112, and a second end opposite to the first end. In example embodiments, the conductive layer pattern 130 may be formed by forming a conductive layer (not shown) on the first insulating layer pattern 120, forming a photoresist pattern (not shown) on the conductive layer, and etching the conductive layer using the photoresist pattern as an etch mask.

The second insulating layer pattern 140 may be formed on the first insulating layer pattern 120 and the conductive layer pattern 130. The second insulating layer pattern 140 may have openings configured to expose the second end of the conductive layer pattern 130. In example embodiments, the second insulating layer pattern 140 may be formed by forming a second insulating layer (not shown) on the first insulating layer pattern 120 and the conductive layer pattern 130, forming a photoresist pattern (not shown) on the second insulating layer, and etching the second insulating layer using the photoresist pattern as an etch mask.

The conductive bumps 150 may be formed in the openings of the second insulating layer pattern 140. The conductive bumps 150 may be electrically connected with the second ends of the conductive layer pattern 130. In example embodiments, the conductive bumps 150 may include solder balls. Further, the conductive bumps 150 may be formed by arranging the solder balls in the openings of the second insulating layer pattern 140, and performing a reflow process using an infrared ray. The conductive bumps 150 may make contact with contact pads of a PCB (not shown). Thus, the conductive bumps 150 may act as an electrical intermediary between the wafer level package 100 and the PCB. Additionally, an under bump metallurgy (UBM) layer may be interposed between the conductive bumps 150 and inner surfaces of the openings.

Referring to FIGS. 1 and 2, the structure may include an electromagnetic wave inducing member 170 and an electromagnetic wave filtering member 180. The electromagnetic wave inducing member 170 may be arranged on a central portion of the second surface of the semiconductor chip 110. An electromagnetic wave applied to the wafer level package 100 may be induced to the electromagnetic wave inducing member 170. That is, the electromagnetic wave inducing member 170 may have a function substantially similar to a lightning rod on which the electromagnetic wave applied to the wafer level package 100 may be concentrated. Thus, the electromagnetic wave inducing member 170 may include a conductor through which a current may flow. In example embodiments, the electromagnetic wave inducing member 170 may have a circular shape.

The electromagnetic wave filtering member 180 may be formed on the second surface of the semiconductor chip 110. The electromagnetic wave filtering member 180 may be configured to surround the electromagnetic wave inducing member 170. The electromagnetic wave filtering member 180 may be spaced apart from the electromagnetic wave inducing member 170. Thus, the electromagnetic wave filtering member 180 may have an opening configured to receive the electromagnetic wave inducing member 170. In example embodiments, because the electromagnetic wave inducing member 170 has the circular shape, the opening of the electromagnetic wave filtering member 180 may have a circular shape larger than the opening of the electromagnetic wave inducing member 170. The electromagnetic wave filtering member 180 may filter the electromagnetic wave concentrated on the electromagnetic wave inducing member 170 to protect the wafer level package 100 from the EMI. Further, the electromagnetic wave filtering member 180 and the electromagnetic wave inducing member 170 may be substantially coplanar with each other.

In example embodiments, an example of an electronic device to which the structure is applied may include the wafer level package 100. Alternatively, the structure of example embodiments may be applied to other semiconductor packages, e.g., a flip chip package, a chip scale package, and a stacked package, as well as the wafer level package 100.

According to example embodiments, after the electromagnetic wave is concentrated on the electromagnetic wave inducing member, the electromagnetic wave filtering member may remove the electromagnetic wave. Therefore, the electromagnetic wave may be effectively removed regardless of positions of the electromagnetic wave applied to the wafer level package.

Figure 3:
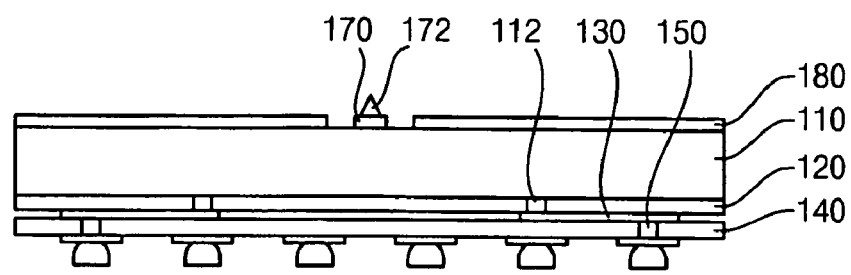

FIG. 3 is a cross-sectional view illustrating a wafer level package in accordance with example embodiments. The wafer level package 100a as illustrated may include elements substantially the same as those of the wafer level package 100a as illustrated in FIG. 1 except for a structure for blocking an EMI. Thus, the same reference numerals may refer to the same elements and any further illustrations with respect to the same element may be omitted herein for brevity.

Referring to FIG. 3, the electromagnetic wave inducing member 170 in the wafer level package of example embodiments may have a protrusion 172 formed on an upper surface of the electromagnetic wave inducing member 170. The protrusion 172 may enlarge an area of the electromagnetic wave inducing member 170 to enhance the concentration of the electromagnetic wave on the electromagnetic wave inducing member 170. Further, the protrusion 172 may have a sharp end. The sharp end of the protrusion 172 may further enhance the concentration of the electromagnetic wave.

In example embodiments, the protrusion 172 may include a conductive material substantially the same as that of the electromagnetic wave inducing member 170. Alternatively, the protrusion 172 may include a conductive material different from that of the electromagnetic wave inducing member 170.

According to example embodiments, the electromagnetic wave may concentrate on the protrusion of the electromagnetic wave inducing member. Therefore, the electromagnetic wave filtering member may have more improved electromagnetic wave removal efficiency.

Figure 4:
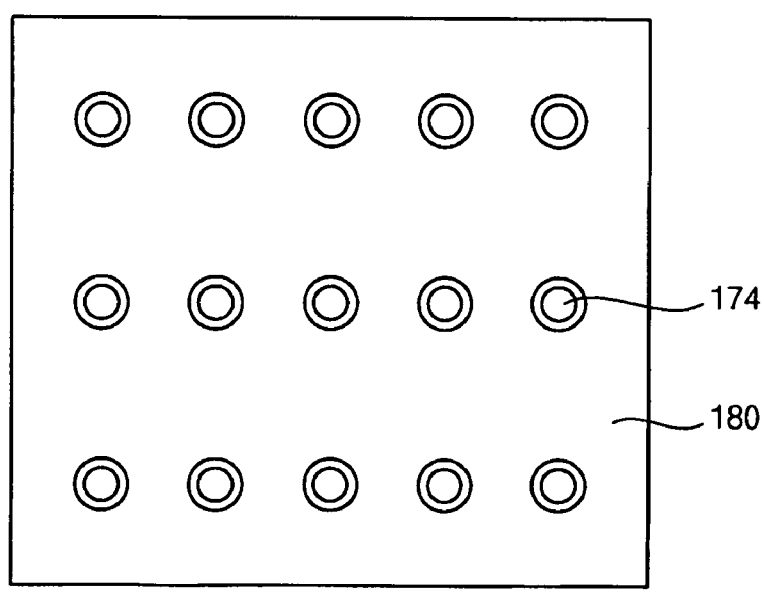

FIG. 4 is a plan view illustrating a wafer level package in accordance with example embodiments. A wafer level package 100b of example embodiments may include elements substantially the same as those of the wafer level package 100a as illustrated in FIG. 1 except for a structure for blocking an EMI. Thus, the same reference numerals may refer to the same elements and any further illustrations with respect to the same element may be omitted herein for brevity.

Referring to FIG. 4, an electromagnetic wave inducing member 174 in the wafer level package 100b of example embodiments may be arranged lengthwise and breadthwise on the second surface of the semiconductor chip 110. Further, the electromagnetic wave inducing member 174 may be spaced apart from each other by substantially the same interval. Thus, the electromagnetic wave filtering member 180 may have a plurality of openings configured to receive the electromagnetic wave inducing members 174. According to example embodiments, the electromagnetic wave inducing members, which may be arranged lengthwise and breadthwise, may effectively remove the electromagnetic wave applied to other portions as well as the central portions of the wafer level package.

Figure 5:
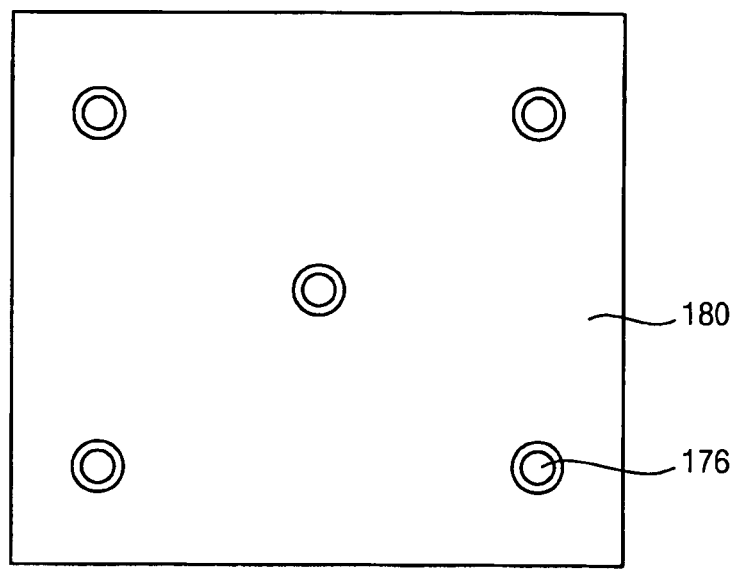

FIG. 5 is a plan view illustrating a wafer level package in accordance with example embodiments. A wafer level package 100c of example embodiments may include elements substantially the same as those of the wafer level package 100a as illustrated in FIG. 1 except for arrangements of an electromagnetic wave inducing members and electromagnetic wave filtering members. Thus, the same reference numerals may refer to the same elements and any further illustrations with respect to the same element may be omitted herein for brevity.

Referring to FIG. 5, the electromagnetic wave inducing members 176 in the wafer level package 100c of example embodiments may be arranged on the central portions and four corner portions of the second surface of the semiconductor chip 110. Thus, the electromagnetic wave filtering member 180 may have a plurality of openings configured to receive the electromagnetic wave inducing members 176.

According to example embodiments, because the electromagnetic wave inducing members may be arranged on the corners of the semiconductor chip, the electromagnetic wave filtering member may effectively remove the electromagnetic wave applied to the corner portions as well as the central portions of the wafer level package.

Figure 6:
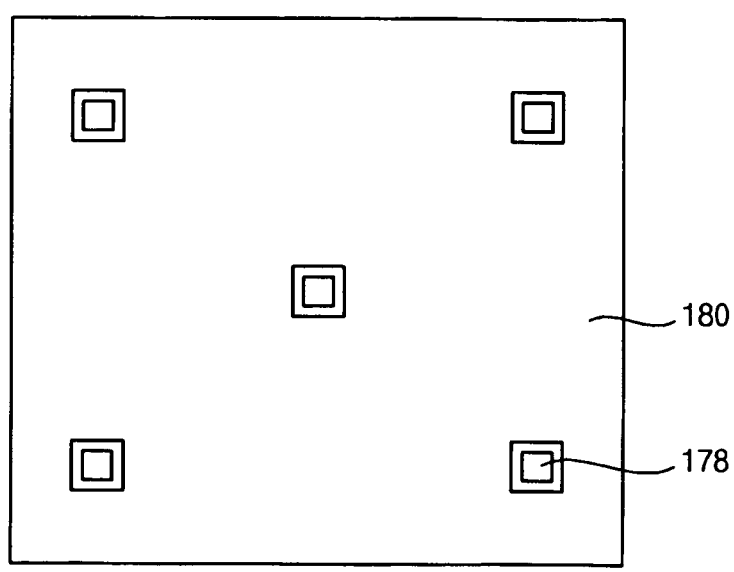

FIG. 6 is a plan view illustrating a wafer level package in accordance with example embodiments. A wafer level package 100d of example embodiments may include elements substantially the same as those of the wafer level package 100a as illustrated in FIG. 1 except for shapes of an electromagnetic wave inducing members and electromagnetic wave filtering members. Thus, the same reference numerals may refer to the same elements and any further illustrations with respect to the same element may be omitted herein for brevity.

Referring to FIG. 6, the electromagnetic wave inducing members 178 in the wafer level package 100c of example embodiments may have a tetragonal shape, particularly a rectangular shape. Thus, the electromagnetic wave filtering member 180 may have a rectangularly shaped openings configured to receive the electromagnetic wave inducing members 178. According to example embodiments, because the electromagnetic wave inducing members are arranged on the corners of the semiconductor chip, the electromagnetic wave filtering member may effectively remove the electromagnetic wave applied to the corner portions as well as the central portions of the wafer level package.

Figure 7:
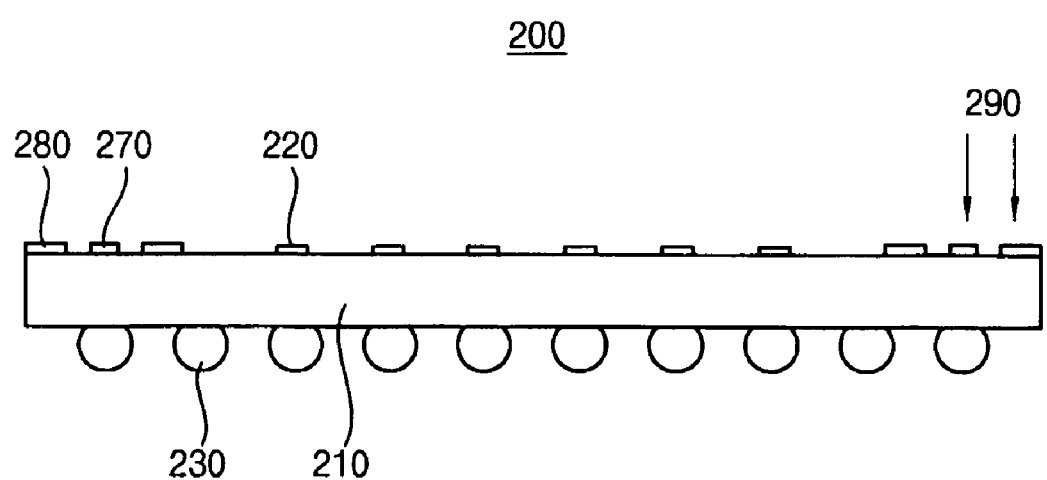

FIG. 7 is a cross-sectional view illustrating a printed circuit board (PCB) in accordance with example embodiments. Referring to FIG. 7, a PCB 200 of example embodiments may include an insulating member 210, contact pads 220, conductive bumps 230 and a structure for blocking an EMI 290.

A circuit (not shown) may be built in the insulating member 210. The contact pads 220 may be arranged on a central portion of a first surface of the insulating member 210. The contact pads 220 may electrically make contact with the conductive bumps 150 of the wafer level package 100 in FIG. 1. The wafer level package 100 in FIG. 1 may be mounted on the central portion of the first surface of the insulating member 210. The conductive bumps 230 may be mounted on a second surface of the insulating member 210 opposite to the first surface. In example embodiments, the conductive bumps 230 may include a solder ball.

The structure for blocking an EMI 290 may include an electromagnetic wave inducing member 270 and an electromagnetic wave filtering member 280. Because the contact pads 220 may be located on the central portion of the first surface of the insulating member 210, the electromagnetic wave inducing member 270 and the electromagnetic wave filtering member 280 may be arranged on edge portions of the first surface of the insulating member 210. In contrast, when the contact pads 220 are located on the edge portions of the first surface of the insulating member 210, the electromagnetic wave inducing member 270 and the electromagnetic wave filtering member 280 may be arranged on the central portions of the first surface of the insulating member 210.

The electromagnetic wave inducing member 270 and the electromagnetic wave filtering member 280 may be substantially the same as the electromagnetic wave inducing member 170 and the electromagnetic wave filtering member 180 as illustrated in FIG. 1, respectively. Further, any one of the structures in example embodiments as illustrated in FIGS. 3 to 6 as well as the structure as illustrated in FIG. 1 may be used in the PCB 200.

According to example embodiments, after the electromagnetic wave is concentrated on the electromagnetic wave inducing member, the electromagnetic wave filtering member may remove the electromagnetic wave. Therefore, the electromagnetic wave may be effectively removed regardless of positions of the electromagnetic wave applied to the PCB.

According to example embodiments, the electromagnetic wave filtering member may remove the electromagnetic wave concentrated on the electromagnetic wave inducing member, so that the electromagnetic wave applied to the wafer level package or the PCB may be effectively removed. Thus, circuits in the wafer level package or the PCB may be protected from the electromagnetic wave.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A structure for blocking electromagnetic interference (EMI) comprising:
at least one electromagnetic wave inducing member included in an electronic device to induce an electromagnetic wave applied to the electronic device; and
an electromagnetic wave filtering member included in the electronic device and spaced apart from the electromagnetic wave inducing member to filter the electromagnetic wave induced on the electromagnetic wave inducing member.

2. The structure of claim 1, wherein the at least one electromagnetic wave inducing member has a protrusion for concentrating the electromagnetic wave on the at least one electromagnetic wave inducing member.

3. The structure of claim 2, wherein the protrusion has a sharp end.

4. The structure of claim 1, wherein the at least one electromagnetic wave inducing member is arranged on a central portion of the electronic device.

5. The structure of claim 1, wherein the at least one electromagnetic wave inducing member is a plurality of electromagnetic wave inducing members arranged on a central portion and an edge portion of the electronic device.

6. The structure of claim 5, wherein the plurality of electromagnetic wave inducing members are lengthwise and breadthwise arranged spaced apart from each other by a similar interval.

7. The structure of claim 1, wherein the at least one electromagnetic wave inducing member has a circular shape or a tetragonal shape.

8. The structure of claim 1, wherein the electromagnetic wave filtering member has a shape configured to surround the at least one electromagnetic wave inducing member.

9. The structure of claim 1, wherein the electromagnetic wave filtering member includes a ferrite material.

10. The structure of claim 1, wherein the electronic device is one of a semiconductor package and a printed circuit board (PCB).

11. A wafer level package comprising:
a semiconductor chip having at least one bonding pad;
a first insulating layer pattern on a first surface of the semiconductor chip, the first insulating layer pattern having at least one opening configured to expose the at least one bonding pad;
a conductive layer pattern on the first insulating layer pattern, the conductive layer pattern having a first end electrically connected to the at least one bonding pad;
a second insulating layer pattern on the first insulating layer pattern, the second insulating layer pattern having at least one opening configured to expose a second end of the conductive layer pattern opposite to the first end; and
the structure according to claim 1,
wherein the at least one electromagnetic wave inducing member and the electromagnetic wave filtering member are on a second surface of the semiconductor chip opposite to the first surface and the electronic device is the semiconductor chip.

12. The wafer level package of claim 11, further comprising:
at least one conductive bump configured to make electrical contact with the second end of the conductive layer pattern.

13. The wafer level package of claim 12, wherein the at least one conductive bump is formed in the at least one opening of the second insulating layer pattern.

14. The wafer level package of claim 12, wherein the at least one conductive bump is at least one solder ball.

15. The wafer level package of claim 12, further comprising:
an under bump metallurgy (UBM) layer between the at least one conductive bump and an inner surface of the at least one opening of the second insulating layer pattern.

16. The wafer level package of claim 11, wherein the first surface is oriented in a downward direction and the second surface is oriented in an upward direction.

17. A printed circuit board (PCB) comprising:
an insulating member including a circuit;
at least one contact pad on a first surface of the insulating member and electrically connected to the circuit; and
the structure according to claim 1,
wherein the at least one electromagnetic wave inducing member and the electromagnetic wave filtering member are on the first surface of the insulating member and the electronic device is the circuit.

18. The PCB of claim 17, further comprising:
at least one conductive bump on a second surface of the insulating member opposite to the first surface and electrically connected to the circuit.

19. The PCB of claim 18, wherein the at least one conductive bump is at least one solder ball.

20. The PCB of claim 17, wherein the at least one contact pad is on a central portion of the first surface of the insulating member.

* * * * *